(12) United States Patent
Meguro

(10) Patent No.: US 9,443,827 B2
(45) Date of Patent: Sep. 13, 2016

(54) SEMICONDUCTOR DEVICE SEALED IN A RESIN SECTION AND METHOD FOR MANUFACTURING THE SAME

(71) Applicant: SPANSION LLC, Sunnyvale, CA (US)

(72) Inventor: Kouichi Meguro, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/521,181

(22) Filed: Oct. 22, 2014

(65) Prior Publication Data

US 2015/0041976 A1    Feb. 12, 2015

Related U.S. Application Data

(62) Division of application No. 13/052,865, filed on Mar. 21, 2011, now Pat. No. 8,900,993, which is a division of application No. 12/098,248, filed on Apr. 4, 2008, now Pat. No. 7,932,616.

(30) Foreign Application Priority Data

Apr. 4, 2007   (JP) .................................. 2007-098763

(51) Int. Cl.
*H01L 21/8238*   (2006.01)
*H01L 21/44*     (2006.01)
(Continued)

(52) U.S. Cl.
CPC ......... *H01L 25/0657* (2013.01); *H01L 21/304* (2013.01); *H01L 21/568* (2013.01);
(Continued)

(58) Field of Classification Search
CPC ............... H01L 2924/01079; H01L 25/0657;
H01L 2924/01013; H01L 2224/48091; H01L 21/76877; H01L 21/76802; H01L 21/76804; H01L 21/76898; H01L 2224/73265; H01L 24/85
USPC ....... 438/106, 121, 108, 109, 612, 666, 112, 438/124, 127, 629, 637, 639, 640, 667, 668, 438/672, 675, 700, 701, 713, 118, 978
See application file for complete search history.

(56) References Cited

U.S. PATENT DOCUMENTS 5,900,676 A * 5/1999 Kweon et al. ................. 257/787
6,838,768 B2 * 1/2005 Corisis et al. ................. 257/738
(Continued)

FOREIGN PATENT DOCUMENTS

JP         11297880 A     10/1999

OTHER PUBLICATIONS

USPTO Final Rejection for U.S. Appl. No. 12/098,248 dated Mar. 22, 21010; 8 pages.
(Continued)

*Primary Examiner* — A. Sefer
*Assistant Examiner* — Dilinh Nguyen

(57) ABSTRACT

A semiconductor device includes a first semiconductor chip having a pad electrode formed on an upper surface thereof; a resin section sealing the first semiconductor chip with the upper surface and a side surface of the first semiconductor chip being covered and a lower surface of the first semiconductor chip being exposed; a columnar electrode communicating between the upper surface and the lower surface of the resin section with the upper surface and the lower surface of the columnar electrode being exposed on the resin section and at least a part of the side surface of the columnar electrode being covered; and a bonding wire connecting the pad electrode and the columnar electrode with a part of the bonding wire being embedded in the columnar electrode as one end of the bonding wire being exposed on the lower surface of the columnar electrode and the remaining part of the bonding wire being covered with the resin section, and a method for manufacturing the same.

15 Claims, 18 Drawing Sheets

(51) Int. Cl.
*H01L 21/4763* (2006.01)
*H01L 21/48* (2006.01)
*H01L 21/50* (2006.01)
*H01L 25/065* (2006.01)
*H01L 21/56* (2006.01)
*H01L 21/683* (2006.01)
*H01L 21/768* (2006.01)
*H01L 23/48* (2006.01)
*H01L 25/10* (2006.01)
*H01L 25/00* (2006.01)
*H01L 21/304* (2006.01)
*H01L 21/78* (2006.01)
*H01L 23/00* (2006.01)

(52) U.S. Cl.
CPC ..... *H01L21/6835* (2013.01); *H01L 21/76898* (2013.01); *H01L 21/78* (2013.01); *H01L 23/481* (2013.01); *H01L 24/11* (2013.01); *H01L 24/17* (2013.01); *H01L 24/18* (2013.01); *H01L 24/48* (2013.01); *H01L 24/49* (2013.01); *H01L 24/73* (2013.01); *H01L 24/82* (2013.01); *H01L 24/85* (2013.01); *H01L 24/91* (2013.01); *H01L 25/0652* (2013.01); *H01L 25/105* (2013.01); *H01L 25/50* (2013.01); *H01L 24/16* (2013.01); *H01L 2221/68345* (2013.01); *H01L 2221/68372* (2013.01); *H01L 2221/68377* (2013.01); *H01L 2224/0401* (2013.01); *H01L 2224/05647* (2013.01); *H01L 2224/13147* (2013.01); *H01L 2224/16054* (2013.01); *H01L 2224/16145* (2013.01); *H01L 2224/16147* (2013.01); *H01L 2224/16225* (2013.01); *H01L 2224/16227* (2013.01); *H01L 2224/1713* (2013.01); *H01L 2224/18* (2013.01); *H01L 2224/32225* (2013.01); *H01L 2224/4847* (2013.01); *H01L 2224/48091* (2013.01); *H01L 2224/48096* (2013.01); *H01L 2224/48145* (2013.01); *H01L 2224/48227* (2013.01); *H01L 2224/48237* (2013.01); *H01L 2224/48463* (2013.01); *H01L 2224/49173* (2013.01); *H01L 2224/73265* (2013.01); *H01L 2224/85001* (2013.01); *H01L 2225/0651* (2013.01); *H01L 2225/06506* (2013.01); *H01L 2225/06513* (2013.01); *H01L 2225/06517* (2013.01); *H01L 2225/06548* (2013.01); *H01L 2225/06568* (2013.01); *H01L 2225/1023* (2013.01); *H01L 2225/1035* (2013.01); *H01L 2225/1058* (2013.01); *H01L 2924/00014* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01014* (2013.01); *H01L 2924/01028* (2013.01); *H01L 2924/01029* (2013.01); *H01L 2924/01033* (2013.01); *H01L 2924/01078* (2013.01); *H01L 2924/01079* (2013.01); *H01L 2924/15331* (2013.01); *H01L 2924/18161* (2013.01); *H01L 2924/18165* (2013.01)

(56) References Cited

U.S. PATENT DOCUMENTS

| | | | |
|---|---|---|---|
| 6,936,929 B1* | 8/2005 | Mostafazadeh et al. | 257/778 |
| 7,932,616 B2 | 4/2011 | Meguro | |
| 2004/0155324 A1 | 8/2004 | Sasaki | |
| 2007/0224781 A1* | 9/2007 | Watanabe | 438/460 |

OTHER PUBLICATIONS

USPTO Final Rejection for U.S. Appl. No. 13/052,865 dated Apr. 22, 2014; 10 pages.
USPTO Non-Final Rejection for U.S. Appl. No. 12/098,248 dated Jul. 19, 2010; 9 pages.
USPTO Non-Final Rejection for U.S. Appl. No. 12/098,248 dated Sep. 30, 2009; 8 pages.
USPTO Non-Final Rejection for U.S. Appl. No. 13/052,865 dated Oct. 7, 2013; 8 pages.
USPTO Notice of Allowance for U.S. Appl. No. 12/098,248 dated Jan. 5, 2011; 7 pages.
USPTO Notice of Allowance for U.S. Appl. No. 13/052,865 dated Aug. 14, 2014; 7 pages.

* cited by examiner

SEMICONDUCTOR DEVICE SEALED IN A RESIN SECTION AND METHOD FOR MANUFACTURING THE SAME

CROSS-REFERENCE TO RELATED APPLICATIONS

This application is a Divisional Application of and claims priority to U.S. patent application Ser. No. 13/052,865, filed on Mar. 21, 2011, which is a Divisional Application of and claims priority to U.S. patent application Ser. No. 12/098,248, filed on Apr. 4, 2008, which is based on Japanese Patent Application No. 2007-098763 filed on Apr. 4, 2007, the entire disclosures of which are hereby incorporated by reference.

TECHNICAL FIELD

The present invention relates to a semiconductor device and a method for manufacturing the same, and more particularly to a semiconductor device having a semiconductor chip being sealed in a resin section and a method for manufacturing the same.

BACKGROUND ART

In order to increase a packaging density, technologies to stack a plurality of semiconductor chips have been developed. To efficiently stack semiconductor chips, a circuit formed on a surface of the semiconductor chip to be electrically connected from an upper surface and a lower surface of the semiconductor chip is preferable. A through-hole electrode provided on the semiconductor chip enables the circuit to be connected from the upper surface and the lower surface of the semiconductor chip. However, providing the through-hole electrode on the semiconductor chip in a manufacturing process is not easy.

Consequently, it is conceivable to provide a resin on a side of a semiconductor chip and to provide a through-hole electrode on the resin. Japanese Patent Application Publication No. JP-A-2003-174120 (Document 1) discloses a technology to form a through-hole electrode: on a wafer surface, a dicing groove is formed, and with a stud bump, a through-hole electrode is formed; a semiconductor chip is connected with the stud bump by a bonding wire; the through-hole electrode and the semiconductor chip are sealed with a resin; and thereafter, by grinding the wafer from behind, the through-hole electrode exposing its upper surface and lower surface is formed.

Japanese Patent Application Publication No. JP-A-2003-7909 (Document 2) discloses another technology to form a through-hole electrode: on a wafer surface, a dicing groove is formed and filled with a resin; on the resin, a through-hole is formed; a circuit is connected with the through-hole using a wiring; inside the through-hole, a through-hole electrode is formed; and thereafter, by grinding the wafer from behind, the through-hole electrode exposing its upper surface and tower surface is formed.

In the technology disclosed in Document 1, as a through-hole electrode is formed with a stud bump, a tall through-hole electrode is difficult to form. As a stud bump is stacked in a plurality of layers, manufacturing work is increased and manufacturing cost is increased. In the technology disclosed in Document 2, as a wiring for the connection between a through-hole electrode and a circuit is formed, manufacturing work is increased and manufacturing cost is increased.

SUMMARY OF THE INVENTION

The present invention addresses the aforementioned problems and aims to provide a semiconductor chip electrically connectable from its upper surface and lower surface to simplify the manufacturing process of a semiconductor device.

According to a first aspect of the present invention, there is provided a semiconductor device includes: a first semiconductor chip having a pad electrode formed on an upper surface thereof; a resin section sealing the first semiconductor chip with the upper surface and a side surface of the first semiconductor chip being covered and a lower surface of the first semiconductor chip being exposed; a columnar electrode communicating between the upper surface and the lower surface of the resin section with the upper surface and the lower surface of the columnar electrode being exposed on the resin section and at least a part of the side surface of the columnar electrode being covered; and a bonding wire connecting the pad electrode and the columnar electrode with apart of the bonding wire being embedded in the columnar electrode so that one end of the bonding wire is exposed on the lower surface of the columnar electrode and the remaining part of the bonding wire is covered with the resin section.

According to a second aspect of the present invention, there is provided a method for manufacturing a semiconductor device includes: providing on a supporting plate a first semiconductor chip having a pad electrode formed on an upper surface thereof; connecting the pad electrode and an upper surface of the supporting plate using a bonding wire; forming on the supporting plate a columnar electrode with a part of the bonding wire being embedded therein, and a resin section sealing the first semiconductor chip, the columnar electrode and the remaining part of the bonding wire, and exposing the upper surface of the columnar electrode; removing the supporting plate; and separating the first semiconductor chip by cutting the resin section along the first semiconductor chip. Accordingly, since the columnar electrode and the pad electrode are connected with the bonding wire, it is possible to reduce the manufacturing cost.

According to a third aspect of the present invention, there is provided a method for manufacturing a semiconductor device includes: forming a groove on a semiconductor wafer having a pad electrode formed on an upper surface thereof; connecting the pad electrode and a lower surface of the groove by a bonding wire; forming on the semiconductor wafer a columnar electrode with a part of the bonding wire being embedded therein, and a resin section sealing the first semiconductor chip, the columnar electrode and the remaining part of the bonding wire, embedding the groove therein, and exposing the upper surface of the columnar electrode; forming the first semiconductor chip from the semiconductor wafer by grinding or polishing a lower surface of the semiconductor wafer so as to expose a lower surface of the columnar electrode; and separating the first semiconductor chip by cutting the resin section along the groove. Accordingly, since the first semiconductor chip is formed from the semiconductor wafer, it is possible to skip the process of arranging the first semiconductor chip. Therefore, the manufacturing cost can be reduced.

DETAILED DESCRIPTION

A description will now be given of embodiments of the present invention with reference to the accompanying drawings.

First Embodiment

Figure 1A:
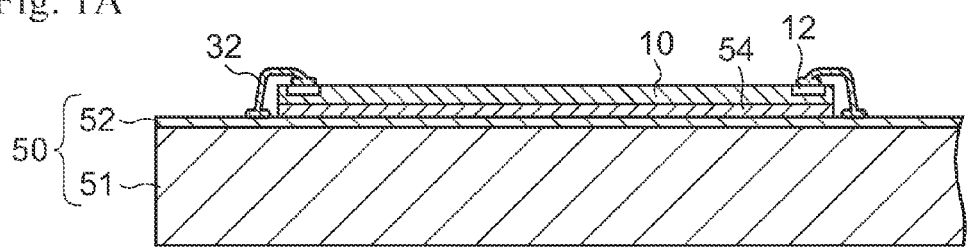
FIGS. 1A to 1D are cross sectional views (part 1) showing a manufacturing process of a semiconductor device of a first embodiment of the present invention.

In reference with FIGS. 1A to 3D, a method for manufacturing a semiconductor device of a first embodiment of the present invention is described. Referring to FIG. 1A, on a silicon (Si) substrate 51, an aluminum (Al) surface layer 52 is formed and a supporting plate 50 composed of the Si substrate 51 and the surface layer 52 is formed. The substrate 51 of the supporting plate 50 may be a substrate of other materials and materials having an even surface and being easy to grind are preferable. The surface layer 52 is preferable to be of a conductive material with which a bonding wire our/hu connected. On the surface layer 52, using a die mount material 54, a first semiconductor chip 10 with a pad electrode 12 formed on an upper surface where a circuit is formed is disposed and bonded. The pad electrode 12 is connected with the surface layer 52 using a bonding wire 32.

Figure 1B:
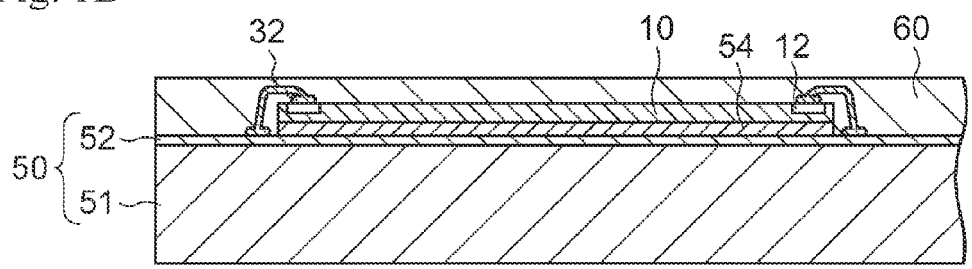
Figure 1C:
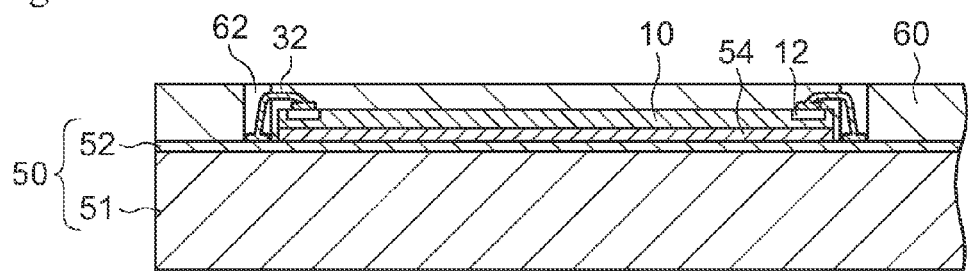
Figure 1D:
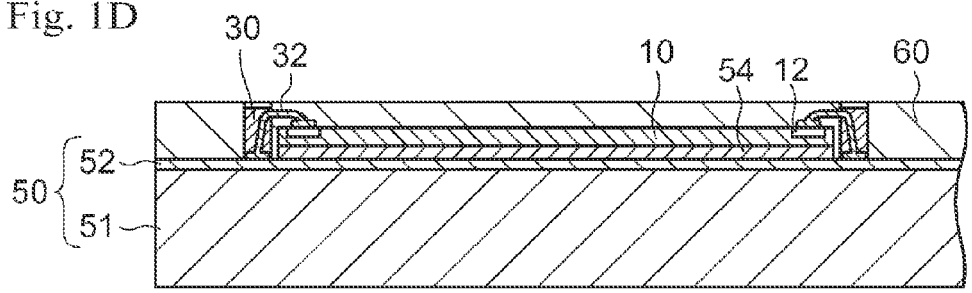

Referring to FIG. 1B, photoresist 60 is coated so as to cover the first semiconductor chip 10 and the bonding wire 32. Referring to FIG. 1C, by exposure and development, an opening section 62 is formed to have a part of the bonding wire 32 included within. Referring to FIG. 1D, using an electrolytic plating method feeding an electric power through the surface layer 52, inside the opening section 62, a columnar electrode 30 composed of copper (Cu) is formed. Consequently, in the columnar electrode 30, a part of the bonding wire 32 is embedded so as to make one end of the bonding wire 32 exposed on a lower surface of the columnar electrode 30.

Figure 2A:
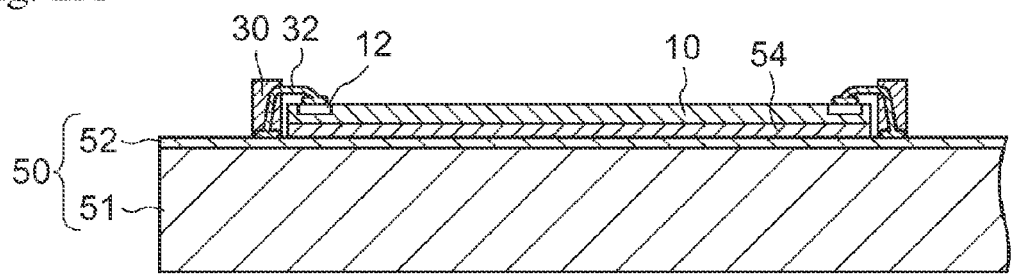
FIGS. 2A to 2C are cross sectional views (part 2) showing the manufacturing process of the semiconductor device of the first embodiment.
Figure 2B:
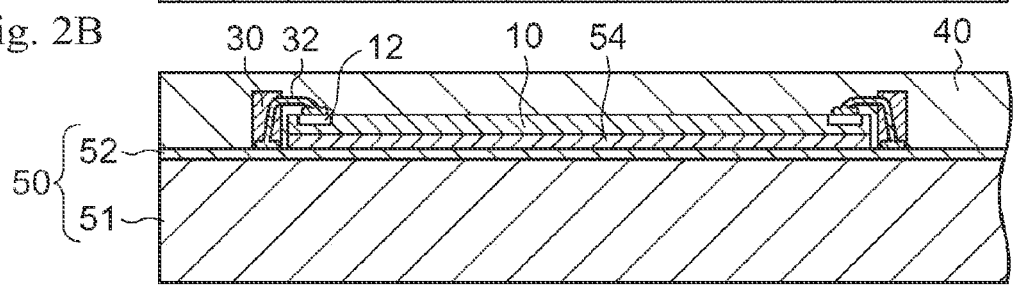
Figure 2C:
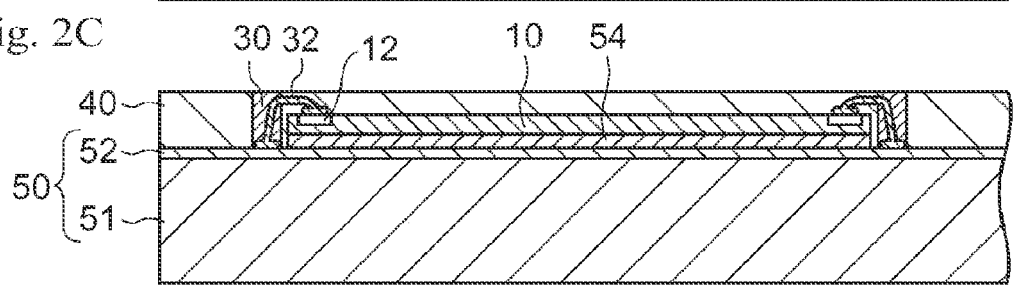

Referring to FIGS. 2A and 2B, after the photoresist 60 is removed, on the supporting plate 30, a resin section 40 is formed so as to make the first semiconductor chip 10, the columnar electrode 30 and the remaining part of the bonding wire 32 sealed. The resin section 40 is formed, using a thermosetting epoxy resin, by disposing the supporting plate 50 in a mold and by hot pressing. Instead, the seal section 40 is formed by spin coating a resin in liquid form and by heating. Referring to FIG. 2C, an upper surface of the resin section 40 is ground until an upper surface of the columnar electrode 30 is exposed.

Figure 3A:
FIGS. 3A to 3D are cross sectional views (part 3) showing the manufacturing process of the semiconductor device of the first embodiment.
Figure 3B:
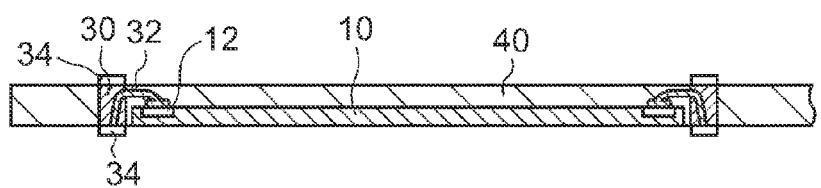
Figure 3C:
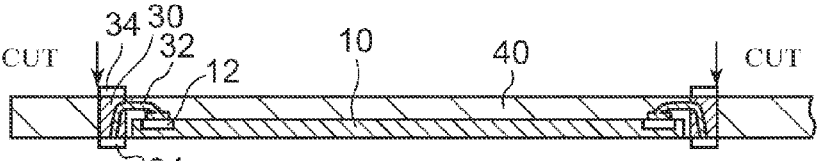
Figure 3D:
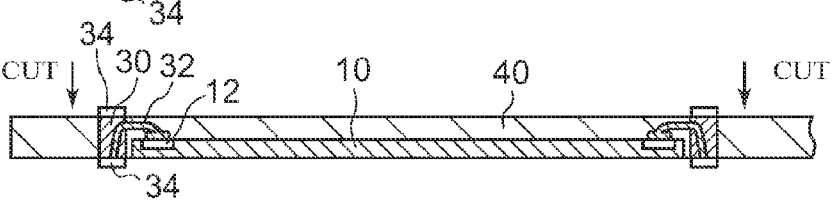

Referring to FIG. 3A, the supporting plate 50, the die mount material 54 and a rear surface of the first semiconductor chip 10 is removed by grinding. Consequently, the upper surface and the lower surface of the columnar electrode 30 are exposed on the resin section 40. Referring to FIG. 3B, on the upper surface and the tower surface of the columnar electrode 30, using a non-electrolytic plating method, a metal layer 34 composed of a nickel (Ni) layer and a gold (Au) layer is formed. The metal layer 34 serves as a barrier when forming solder and such on the columnar electrode 30. Referring to FIG. 3C, using a dicing method, the resin section 40 is cut out between the first semiconductor chips 10 so as to make aside surface of the columnar electrode 30 exposed and to separate the first semiconductor chips 10. This completes the semiconductor device of the first embodiment of the present invention. When cutting the resin section 40, in reference with a modification example shown in FIG. 3D, the resin section 40 may be cut not to make the side surface of the columnar electrode 30 exposed.

Figure 4A:
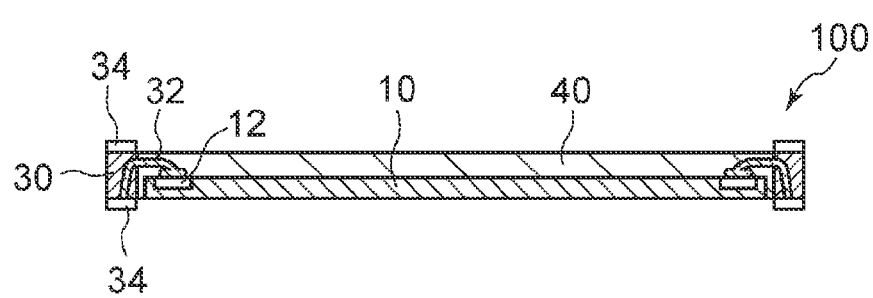
FIG. 4A is a cross sectional view of the semiconductor device of the first embodiment and FIG. 4B is its plan view viewed through a resin section with bonding wires and pad electrodes being omitted.
Figure 4B:
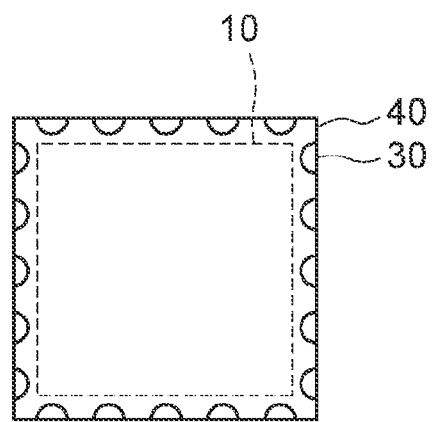

FIG. 4A is a cross sectional view of the semiconductor device of the first embodiment and FIG. 4B is its plan view. In the semiconductor device of the first embodiment, on the upper surface of the first semiconductor chip 10, the pad electrode 12 which is electrically connected with a circuit is formed. The resin section 40 seals the first semiconductor chip 10 as the upper surface and side surfaces of the first semiconductor chip 10 being covered and the lower surface of the first semiconductor chip 10 being exposed. The columnar electrode 30 communicates between the upper surface and the lower surface of the resin section 40, and the upper surface, the lower surface and an outer side surface of the columnar electrode 30 are exposed on the resin section 40 and an inner side surface of the columnar electrode 30 is covered with the resin section 40. The bonding wire 32 connects the pad electrode 12 with the columnar electrode 30. A part of the bonding wire 32 is embedded in the columnar electrode 30 so as to have one end of the bonding wire 32 exposed on the lower surface of the columnar electrode 30 and the remaining of the bonding wire 32 section is covered with the resin section 40.

Figure 5A:
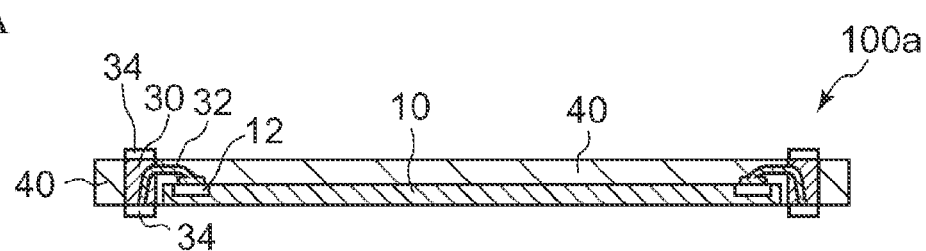
FIG. 5A is a cross sectional view of a modification example of the semiconductor device of the first embodiment and FIG. 5B is a plan view viewed through the resin section with the bonding wires and the pad electrodes being omitted.
Figure 5B:
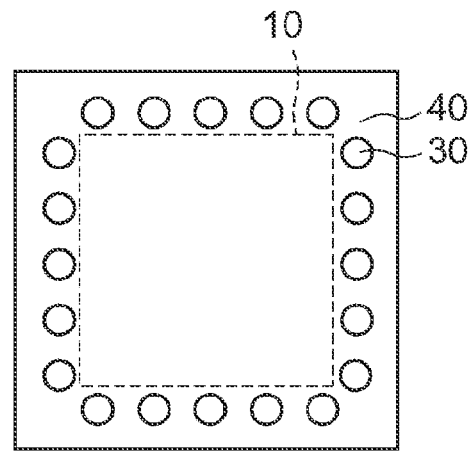

FIG. 5A is across sectional view of a modification example of the semiconductor device of the first embodiment and FIG. 5B is its plan view. In the semiconductor device of the modification example of the first embodiment, contrary to the semiconductor device of the first embodiment, the side surfaces of the columnar electrode 30 are surrounded by the resin section 40. Other configurations are the same as those of the first embodiment shown in FIGS. 4A and 4B and their descriptions are omitted.

In accordance with the first embodiment and the modification example of the first embodiment, as the columnar electrode 30 which is electrically connected with the semiconductor chip 10 is exposed on the upper surface and the lower surface of the resin section 40, an electrical connection to the first semiconductor chip 10 can be made from the upper surface and the lower surface. Consequently, as described in a sixth embodiment, semiconductor devices can be stacked. Furthermore, a test performed prior to stacking becomes easy. As the columnar electrode 30 is provided on the resin section 40, providing a through-hole electrode on the semiconductor chip is not required.

As in the first embodiment, when the outer side surface of the columnar electrode 30 is being exposed on the resin section 40, the first semiconductor chip 10 can be connected not only from the upper surface and the lower surface but also from the side surface. Meanwhile, as in the modification example of the first embodiment, when the side surface of the columnar electrode 30 is being surrounded by the resin section 40, the strength of the resin section 40 is maintained.

As long as a part of the bonding wire 32 is embedded within the columnar electrode 30, the first semiconductor chip 10 can be electrically connected with the columnar electrode 30. However, the bonding wire 32 being embedded in the columnar electrode 30 so as to have one end of the bonding wire 32 exposed on the lower surface of the columnar electrode 30 is preferable.

As shown in FIG. 1A, the pad electrode 12 is connected with the upper surface of the supporting plate 50 using the bonding wire 32. As shown in FIGS. 1B to 2C, on the supporting plate 50, the columnar electrode 30 and the resin section 40 are formed. In the columnar electrode 30, a part of the bonding wire 32 is embedded. The resin section 40 seals the first semiconductor chip 10, the columnar electrode 30 and the remaining part of the bonding wire 32 and the upper surface of the columnar electrode 30 is exposed on the resin section 40. As shown in FIG. 3A, the supporting plate 50, the die mount material 54 and the back surface of the semiconductor chip 10 is removed by grinding. In the abovementioned manufacturing method, the columnar electrode 30 can be formed, for example, by plating method. Consequently, compared with the technology which uses a stud bump as described in Document 1, the manufacturing cost can be cut down. As the connection of the columnar electrode 30 and the pad electrode 12 is made using the bonding wire 32, a process to form a wiring as described in Document 2 can be skipped. Consequently, the manufacturing cost is cut down.

The method for forming the columnar electrode 30 and the resin section 40 is as follows. As shown in FIG. 1D, on the supporting plate 50, the columnar electrode 30 is formed so as to have apart of the bonding wire 32 embedded. As shown in FIG. 2B, the resin section 40 is formed so as to make the first semiconductor chip 10, the remaining part of the bonding wire 32 and the columnar electrode 30 sealed. As shown in FIG. 2C, the upper surface of the resin section 40 is ground so as to make the upper surface of the columnar electrode 30 exposed. This completes the forming of the columnar electrode 30 and the resin section 40.

Second Embodiment

Figure 6A:
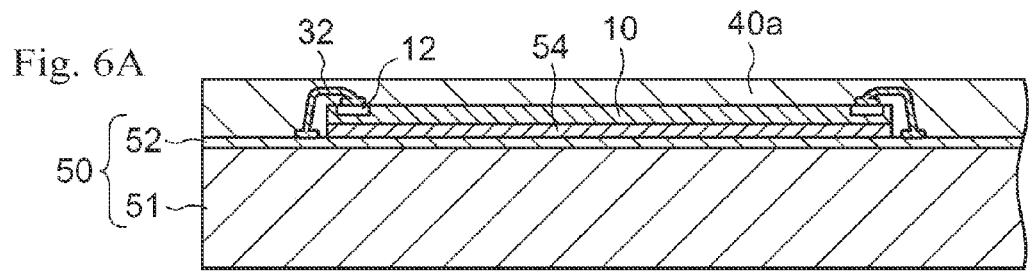
FIGS. 6A to 6D are cross sectional views showing a manufacturing process of a semiconductor device of a second embodiment.

A second embodiment of the present invention is an instance of using a mask for forming a columnar electrode as a resin section. Referring to FIGS. 6A to 6D, a method for manufacturing a semiconductor device of the second embodiment is described. Referring to FIG. 6A, after conducting processes shown in FIG. 1A of the first embodiment, an as to make a first semiconductor chip 10 and a bonding wire 32 covered, a resin section 40a is formed by spin coating a photosensitive thermosetting epoxy resin. Referring to FIG. 69, by performing a light exposure and development, on the resin section 40a, a through-hole 48 which includes a part of the bonding wire 32 is formed. By a heat process, the resin section 40a is hot cured. Referring to FIG. 6C, by supplying an electric current through a surface layer 52, inside the through-hole 48, a columnar electrode 30 composed of Cu is formed using an electrolytic plating method. Referring to FIG. 6D, similar to those in FIG. 3A of the first embodiment, a supporting plate 50, a die mount material 54 and a back surface of the semiconductor chip 10 are ground and removed. Thereafter, by performing the processes in FIGS. 38 and 3C of the first embodiment, the semiconductor device of the second embodiment is completed.

Figure 6B:
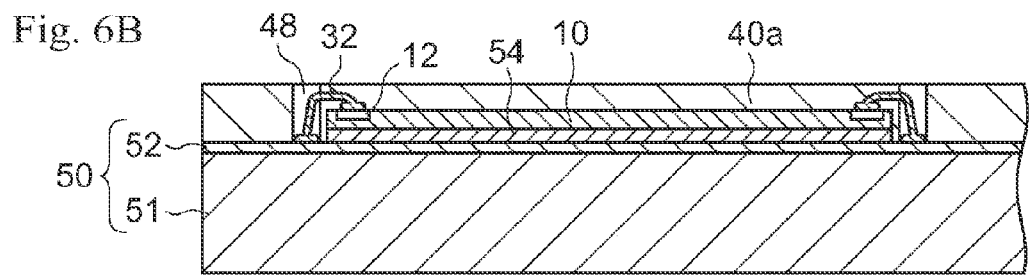
Figure 6C:
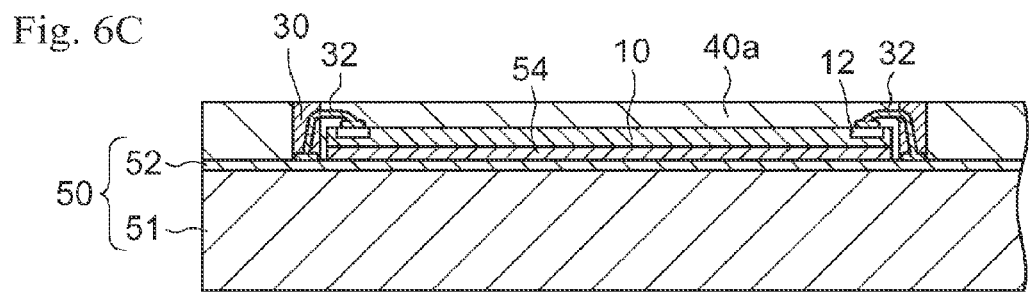
Figure 6D:
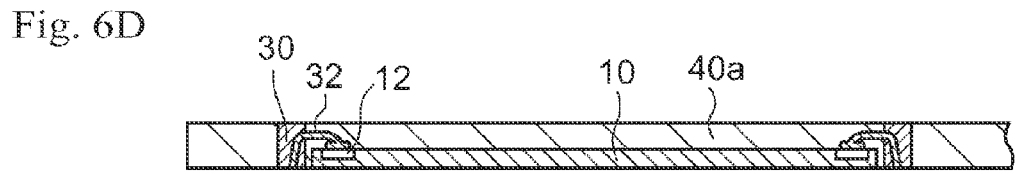

In accordance with the second embodiment, as shown in FIGS. 6A and 6B, the resin section 40a having the through-hole 48 in which a columnar electrode is formed is formed, and as shown in FIG. 6C, inside the through-hole 48, the columnar electrode 30 is formed. Consequently, the columnar electrode 30 and the resin section 40a are formed. Therefore, compared with those of the first embodiment, a peeling process of a photoresist 60 in FIG. 2A, a forming process of a resin section 40 in FIG. 2B and a grinding process of the resin section 40 in FIG. 2C are not required. Consequently, the manufacturing process is cut down. However, in the second embodiment, the resin section 40a is required to use a resin which is photosensitive and is available for spin coating. For this reason, the options for selecting materials for the resin section 40a become small. Therefore, to expand the options for selecting materials for the resin section 40a, for example to select by cost and property of resin, it is preferable to use the first embodiment.

Third Embodiment

Figure 7A:
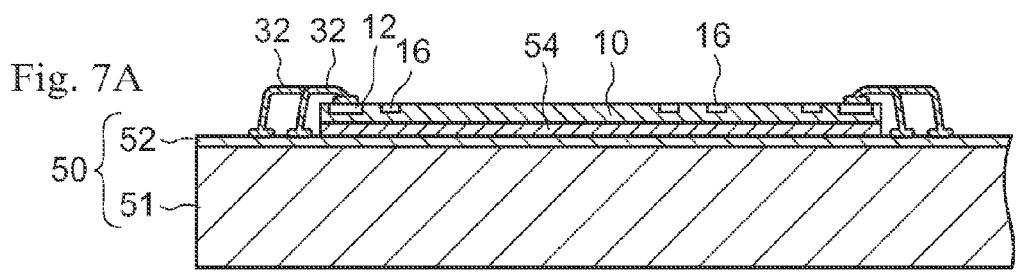
FIGS. 7A to 7D are cross sectional views (part 1) showing a manufacturing process of a semiconductor device of a third embodiment.

A third embodiment of the present invention is an instance of a second semiconductor chip being bonded on a first semiconductor chip 10 by flip-chip bonding, hereinafter abbreviated as FCB. Referring to FIGS. 7A to 8C, a method for manufacturing a semiconductor device of the third embodiment is described. Referring to FIG. 7A, the processes similar to those in FIG. 1A of the first embodiment are performed. A bonding wire 32 is formed so as to be arranged in two rows on the outer side of a first semiconductor chip 10. In FIG. 8A, while two bonding wires 32 are shown superposed, the bonding wires 32 are provided separately in a depth direction of the drawing in FIG. 8A as shown in later described FIG. 9C.

Figure 7B:
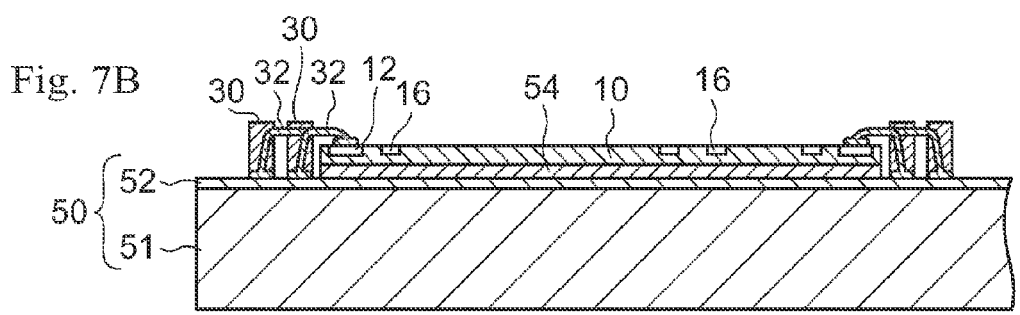
Figure 7C:
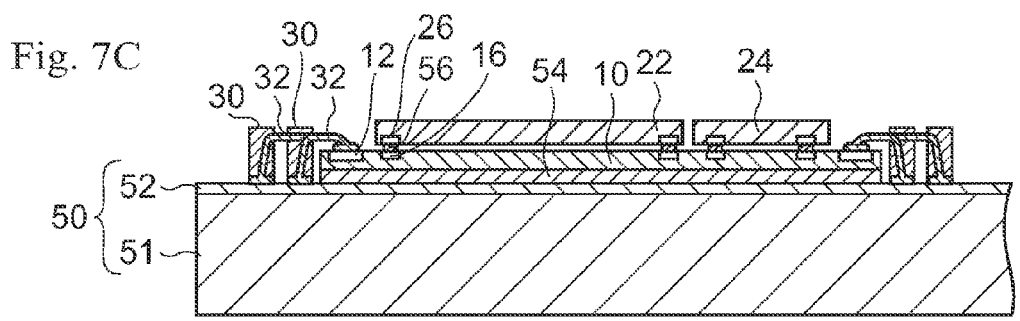
Figure 7D:
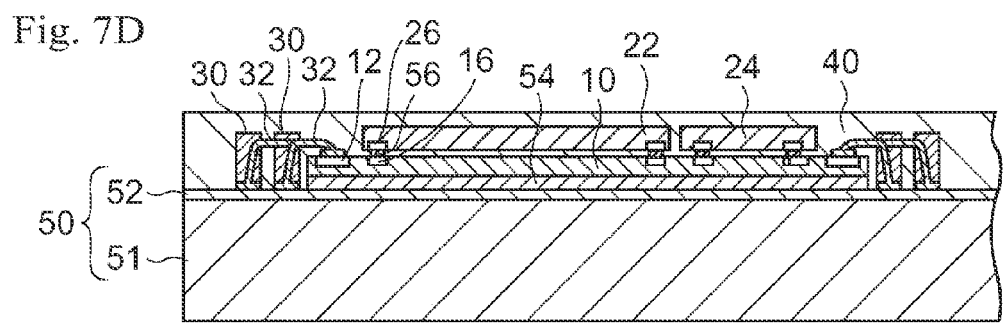
Figure 8A:
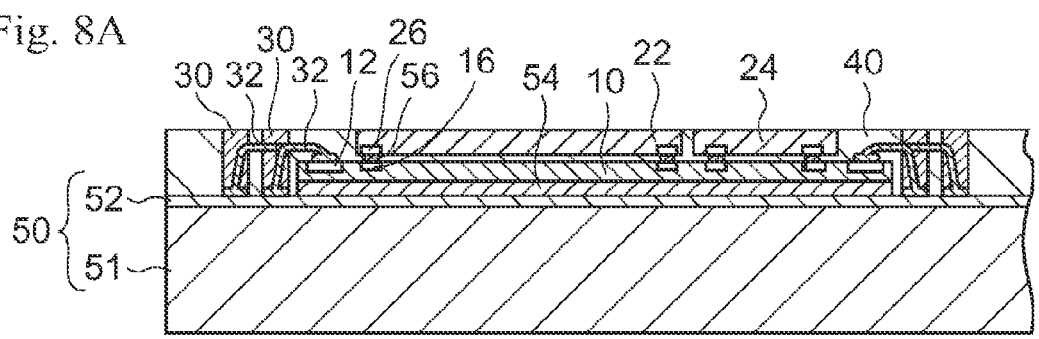
FIGS. 8A to 8C are cross sectional views (part 2) showing the manufacturing process of the semiconductor device of the third embodiment.

Referring to FIG. 7B, similar to those in FIGS. 1B to 2A of the first embodiment, on a supporting plate 50, a columnar electrode 30 is formed so as to have a part of the bonding wire 32 embedded. Referring to FIG. 7C, on the first semiconductor chip 10, second semiconductor chips 22 and 24 are bonded by FCB. Consequently, a pad electrode 16 formed on an upper surface of the first semiconductor chip 10 and pad electrodes 26 formed on lower surfaces, i.e. the surfaces on which circuits are formed, of the second semiconductor chips 22 and 24 are connected by a bump 56. Referring to FIG. 7D, similar to those in FIG. 2B of the first embodiment, a resin section 40 is formed so as to make the first semiconductor chip 10, the second semiconductor chips 22 and 24, the columnar electrode 30 and the bonding wire 32 sealed.

Figure 8B:
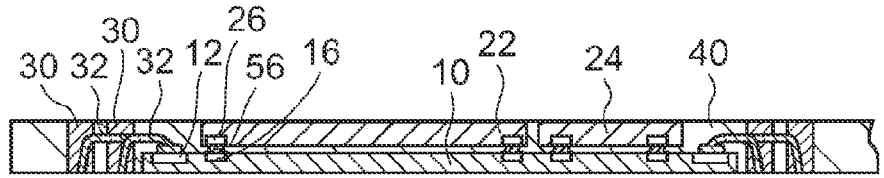
Figure 8C:
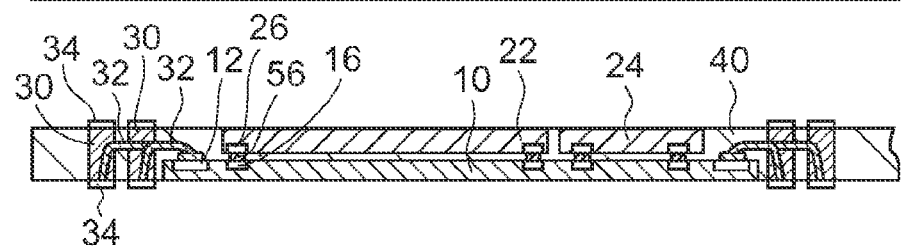

Referring to FIG. 8A, the resin section 40 and the second semiconductor chips 22 and 24 are ground so as to expose upper surfaces of the second semiconductor chips 22 and 24 and an upper surface of the columnar electrode 30. Referring to FIG. 8B, similar to those in FIG. 2B of the first embodiment, a supporting plate 50, a die mount material 54 and a back surface of the first semiconductor chip 10 are removed by grinding. Consequently, a lower surface of the columnar electrode 30 and a lower surface of the first semiconductor chip 10 are exposed. Referring to FIG. 8C, similar to those in FIG. 2C of the first embodiment, on the upper surface undo lower surface of the columnar electrode 30, a metal layer 34 is formed. Thereafter, similar to those in FIG. 3C or 3D of the first embodiment, the resin section 40 is cut by a dicing method and the semiconductor device of the third embodiment is completed.

Figure 9A:
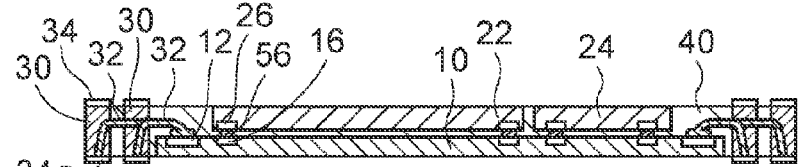
FIG. 9A is a cross sectional view of the semiconductor device of the third embodiment.
Figure 9B:
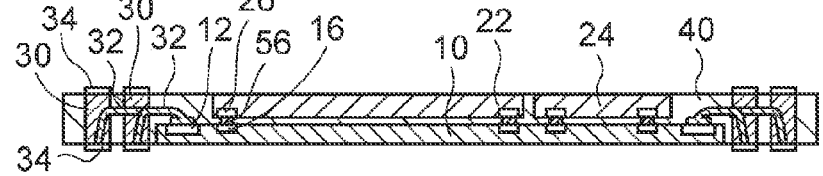
FIG. 9B is a cross sectional view of a semiconductor device of a modification example of the third embodiment.
Figure 9C:
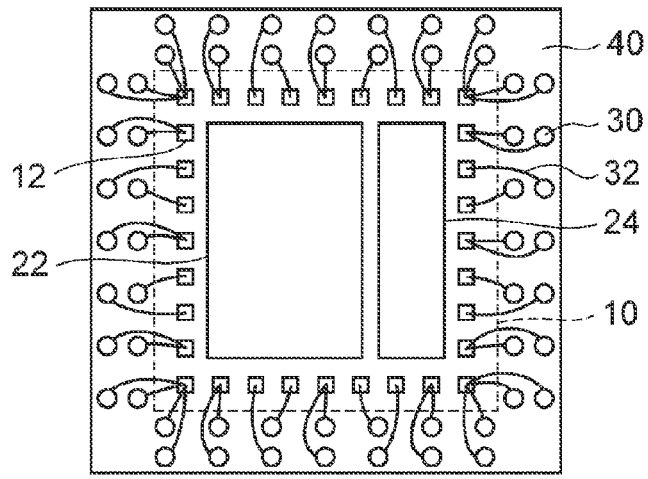
FIG. 9C is its plan view viewed through a resin section and FIG. 9D is a plan view of a semiconductor device of another modification example of the third embodiment viewed through a resin section.
Figure 9D:
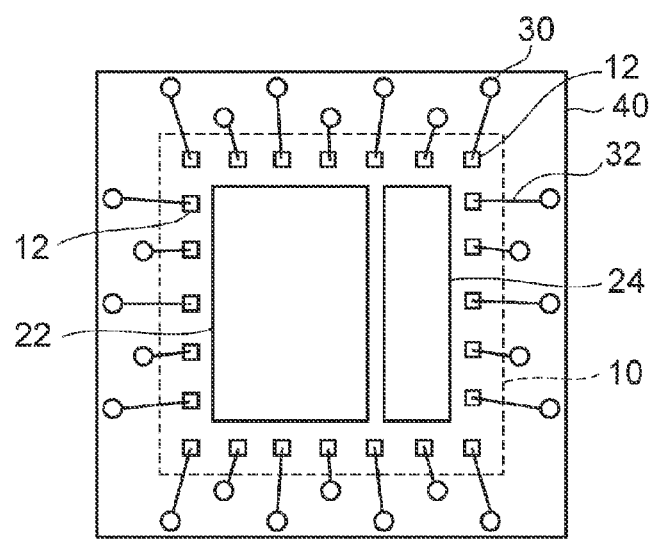

FIG. 9A is a cross sectional view of the semiconductor device of the third embodiment, FIG. 9B is a cross sectional view of a modification example of the third embodiment, and FIG. 9C is a plan view of the semiconductor device of the modification example of the third embodiment viewed through a resin section 40. FIG. 9D is a plan view of a semiconductor device of another modification example of the third embodiment viewed through a resin section 40. As shown in FIG. 9A, an outer side surface of the columnar electrode 30 may be exposed on the resin section 40 or, as shown in FIG. 9B, a side surface of a columnar electrode 30 may be surrounded by the resin section 40. Referring to FIG. 9C, a pad electrode 12 and the columnar electrode 30 are appropriately connected using a bonding wire 32. As shown in FIG. 9D, in a depth direction of the drawing in FIG. 8A, a columnar electrode 30 may be alternately provided on an inner row and an outer row of a first semiconductor chip 10.

In accordance with the third embodiment, the second semiconductor chips 22 and 24 are bonded by FCB on the first semiconductor chip 10 with their lower surfaces and side surfaces being covered with the resin section 40 and their upper surfaces being exposed on the resin section 40. As described above, the second semiconductor chips 22 and 24 can be electrically connected, through a wiring (not shown) formed on the first semiconductor chip 10, with the columnar electrode 30. Therefore, from the upper surface and the lower surface of the columnar electrode 30, in addition to the first semiconductor chip 10, the second semiconductor chips 22 and 24 can be electrically connected. Consequently, the packaging density of the semiconductor chips is improved.

As shown in FIG. 7C, on the first semiconductor chip 10, the second semiconductor chips 22 and 24 are bonded by FCB. As shown in FIG. 8A, so as to have the upper surfaces of the second semiconductor chips 22 and 24 exposed, the resin section 40 is formed. When exposing the second semiconductor chips 22 and 24 on the resin section 40, as shown in FIG. 8A, it is preferable to grind, together with the resin section 40, the upper surfaces of the second semiconductor chips 22 and 24. When bonding the semiconductor chip by FCB, as handling of the semiconductor chip becomes difficult, it is difficult to make a thickness of the semiconductor to be less than 100 μm. In accordance with the third embodiment, as the upper surfaces of the second semiconductor chips 22 and 24 are ground together with the resin section 40, the chip thickness of the second semiconductor chips 22 and 24 can be made thin. Consequently, the packaging density of the semiconductor chips is improved.

In the third embodiment, while two pieces of the second semiconductor chips 22 and 24 are bonded by FCB onto a single piece of the first semiconductor chip 10, a single piece or pieces of three or more of the second semiconductor chips may be bonded by FCB. In the semiconductor devices of the first embodiment and the second embodiment, similar to the third embodiment, the columnar electrodes 30 may be formed in two or more rows on an outer side of the first semiconductor chip 10.

Fourth Embodiment

Figure 10A:
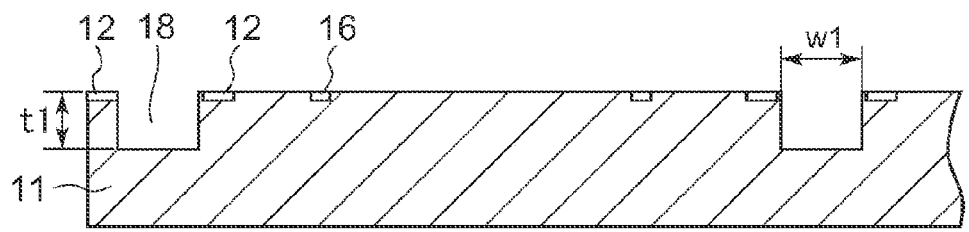
FIGS. 10A to 10C are cross sectional views (part 1) showing a manufacturing process of a semiconductor device of a fourth embodiment.

A fourth embodiment of the present invention is an instance of manufacturing a semiconductor device using a semiconductor wafer without using a supporting plate. Referring to FIGS. 10A to 13C, a method for manufacturing a semiconductor device of the fourth embodiment is described. Referring to FIG. 10A, on a semiconductor wafer 11 on which a pad electrode 16 is formed on an upper surface where a circuit is formed, a groove 18 is formed. The groove 18 is formed by half-dicing and its width w1 is, for example 120 μm and its depth t1 is, for example 100 μm. As described later, the groove 18 is formed, so as to have a first semiconductor chip 10 to be formed on the semiconductor wafer 11, on the periphery of a circuit (not shown) in a grid pattern.

Figure 10B:
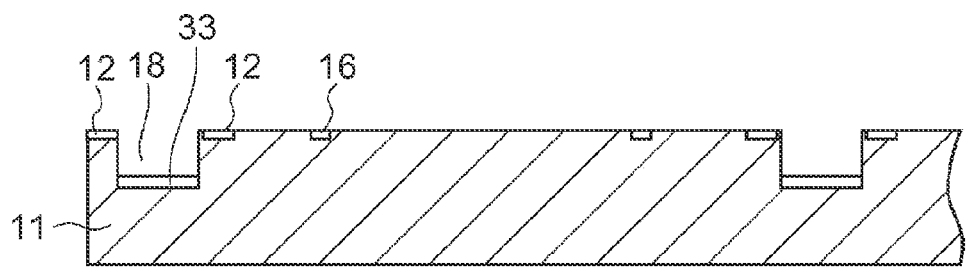
Figure 10C:
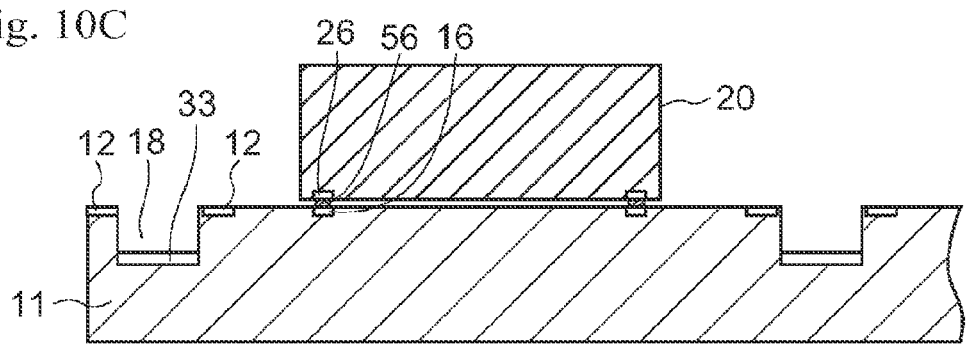

Referring to FIG. 10B, on a lower surface of the groove 18, a conductive layer 33 composed of Al is vapor deposited. The conductive layer 33 is preferable to be connectable with a bonding wire and to have electrical conductivity. Referring to FIG. 10C, on the semiconductor wafer 11, a second semiconductor chip 20 is bonded by FCB. Consequently, the pad electrode 16 formed on the upper surface of the semiconductor wafer 11 and a pad electrode 26 formed on the lower surface of the second semiconductor chip 20 where a circuit is formed are connected by a bump 56.

Figure 11A:
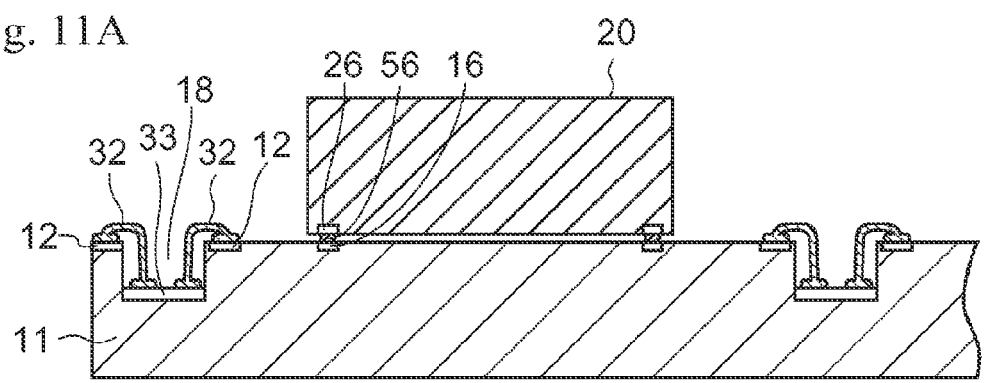
FIGS. 11A to 11C are cross sectional views (part 2) showing the manufacturing process of the semiconductor device of the fourth embodiment.
Figure 11B:
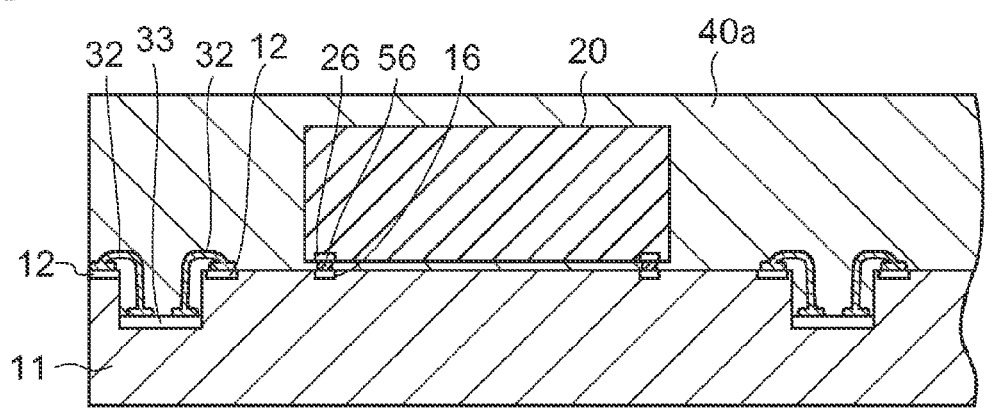
Figure 11C:
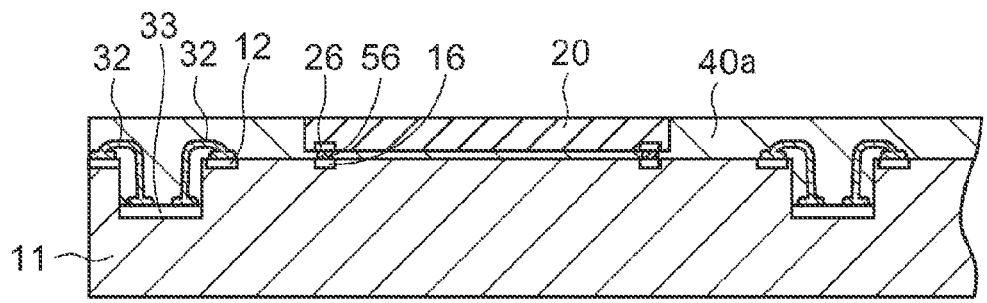

Referring to FIG. 11A, a pad electrode 12 arranged on both sides of the groove 18 and the conductive layer 33 on the lower surface of the groove 18 are connected using a bonding wire 32. Referring to FIG. 11B, similar to those in FIG. 2B of the first embodiment, a resin section 40a is formed using a resin which is photosensitive and available for spin coating so as to seal the second semiconductor chip 20 and the bonding wire 32 and to fill the groove 18. Referring to FIG. 11C, the second semiconductor chip 20 and the resin section 40a are ground. Consequently, an upper surface of the second semiconductor 20 is exposed.

Figure 12A:
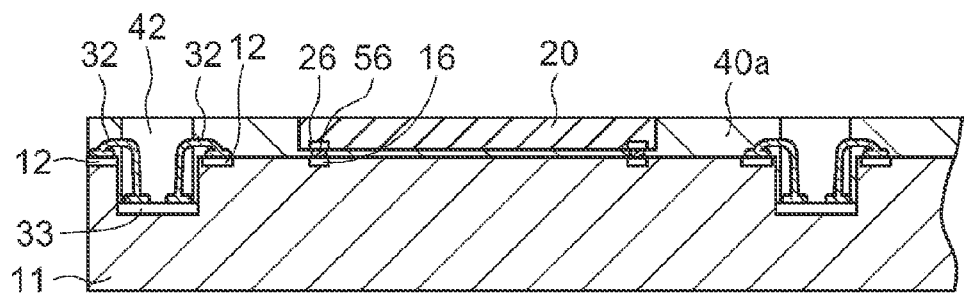
FIGS. 12A to 12C are cross sectional views (part 3) showing the manufacturing process of the semiconductor device of the fourth embodiment.
Figure 12B:
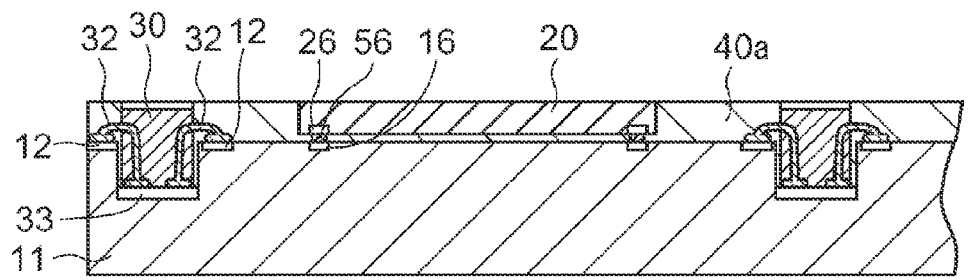
Figure 12C:
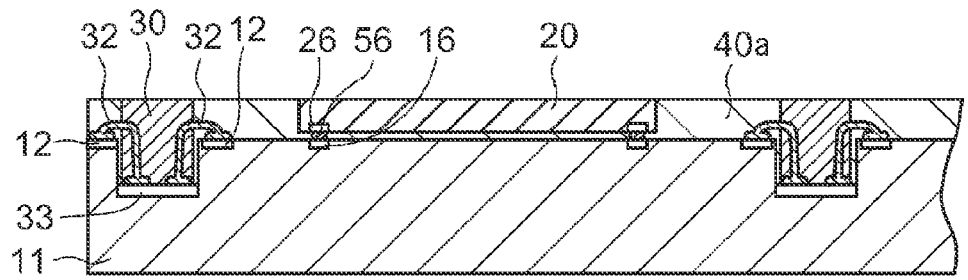

Referring to FIG. 12A, in the resin section 40a above the groove 18 of the semiconductor wafer 11, a through-hole 42 which includes a part of the bonding wire 32 is formed. Referring to FIG. 12B, by supplying an electric current through the conductive layer 33, inside the through-hole 42, a columnar electrode 30 composed of Cu is formed using an electrolytic plating method. In this case, as the conductive layer 33 is formed in a grid pattern, the electric current for plating can be supplied from the periphery of the semiconductor wafer 11. Referring to FIG. 12C, so as to make the resin section 40a and an upper surface of the columnar electrode 30 flat, the second semiconductor 20 and the resin section 40a are ground, in FIG. 12B, when a step between the resin section 40a and the upper surface of the columnar electrode 30 is slight enough not to cause problems, the process in FIG. 12C may not be performed.

Figure 13A:
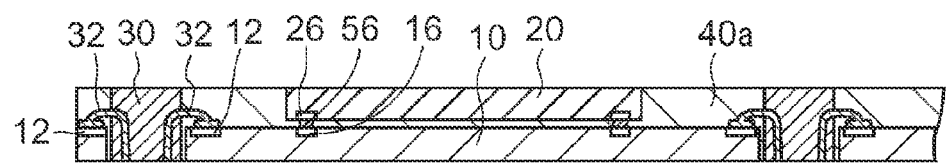
FIGS. 13A to 13C are cross sectional views (part 4) showing the manufacturing process of the semiconductor device of the fourth embodiment.
Figure 13B:
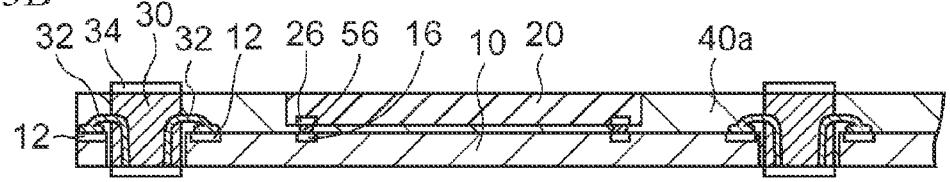
Figure 13C:
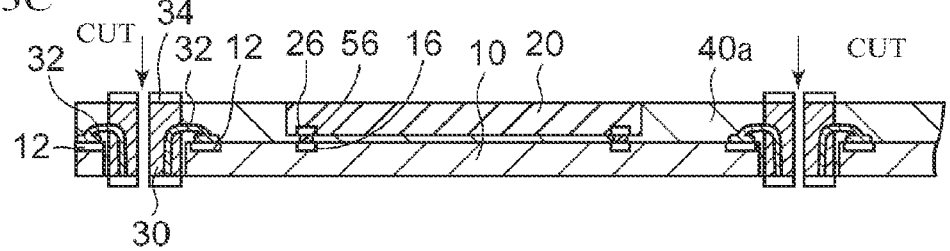

Referring to FIG. 13A, a lower surface of the semiconductor wafer 11 is ground so as to expose a lower surface of the columnar electrode 30. Consequently, from the semiconductor wafer 11, the mutually detached first semiconductor chips 10 are formed. Referring to FIG. 13B, on the upper surface and the lower surface of the columnar electrode 30, a metal layer 34 composed of a Ni layer and a Cu layer is formed using a non-electrolytic plating method. Referring to FIG. 13C, along the groove 18, the columnar electrode 30 and the resin section 40a are cut off. Consequently, the first semiconductor chips 10 are separated. When separating the first semiconductor chips 10, a dicing method is used using a blade of narrower width than that of the blade used in half dicing in FIG. 10A.

Figure 14:
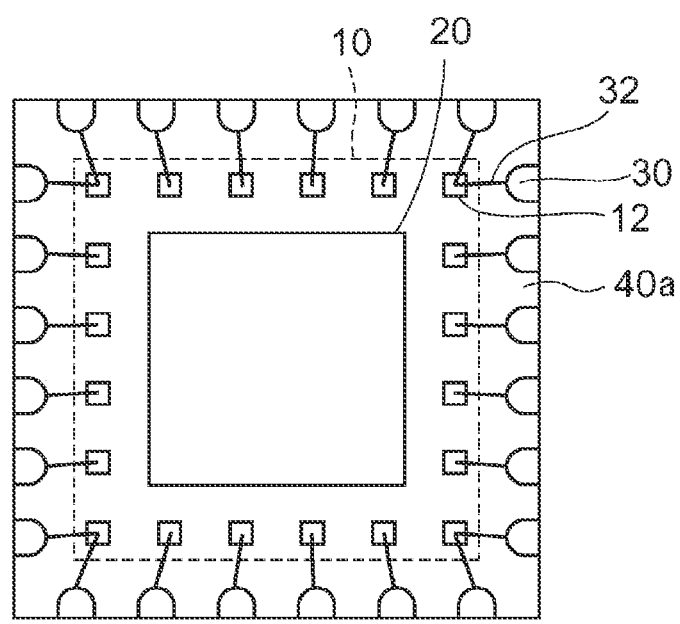
FIG. 14 is a plan view of the semiconductor device of the fourth embodiment viewed through a resin section.

FIG. 14 is a plan view of the semiconductor device of the fourth embodiment viewed through the resin section. As the columnar electrode 30 is cut off, the outer side surface of the columnar electrode 30 is exposed on the resin section 40a.

In accordance with the fourth embodiment, as shown in FIG. 10A, on the semiconductor wafer 11 where the pad electrode 12 is formed on the upper surface thereof, the groove 18 is formed. As shown in FIG. 11A, the pad electrode 12 and the lower surface of the groove 18 are connected using the bonding wire 32. As shown in FIGS. 11B to 12C, the columnar electrode 30 and the resin section 40a are formed. The columnar electrode 30 is formed so as to have a part of the bonding wire 32 embedded on the groove 18. The resin section 40a is formed so as to seal the first semiconductor chip 10, the columnar electrode 30 and the remaining part of the bonding wire 32 and to expose the upper surface of the columnar electrode 30. As shown in FIG. 13A, the lower surface of the semiconductor wafer 11 is ground so as to expose the lower surface of the columnar electrode 30 and, from the semiconductor wafer 11, the first semiconductor chip 10 is formed. As just described above, without using a supporting plate 50 as in the cases used in the first to third embodiments, by forming the groove 18 on the semiconductor wafer 11, a semiconductor device can be manufactured. While a process to arrange the first semiconductor chip 10 on the supporting plate 50 is required in accordance with the first to third embodiments, in accordance with the fourth embodiment, this process can be skipped.

In accordance with the fourth embodiment, on the first semiconductor chip 10, the second semiconductor chip 20 may not be bonded by FCB. On the contrary, onto a single piece of the first semiconductor chip 10, two or more of the second semiconductor chips 20 may be bonded by FCB.

In the fourth embodiment, the columnar electrode 30 and the resin section 40a are formed in the way similar to those in the second embodiment. More specifically, as shown in FIGS. 11B to 12A, the resin section 40a is formed having the through-hole 42 in which the columnar electrode 30 is to be formed, and as shown in FIGS. 12B and 12C, inside the through-hole 42, the columnar electrode 30 is formed.

However, the columnar electrode 30 and the resin section 40a may be formed in the way similar to those in the first embodiment. More specifically, the columnar electrode 30 is formed so as to have a part of the bonding wire 32 embedded on the lower surface of the groove 18; the resin section 40a is formed so as to seal the first semiconductor chip 10, the remaining part of the bonding wire 32 and the columnar electrode 30; and the upper surface of the resin section 40a is ground so as to expose the upper surface of the columnar electrode 30. In the way described above, the columnar electrode 30 and the resin section 40a may be formed.

Further, as shown in FIGS. 12A and 12B, the columnar electrode 30 is formed so as to embed a plurality of bonding wires 32 which respectively connect the pad electrodes 12 of different first semiconductor chips with the lower surface of the groove 18. As shown in FIG. 13C, when separating the first semiconductor chips 10, the columnar electrode 30 is cut off so as to have a plurality of bonding wires 32 respectively belonged to the different semiconductor chips 10. Consequently, as shown in FIG. 14, the side surface of the columnar electrode 30 is exposed on the resin section 40a.

Fifth Embodiment

Figure 15A:
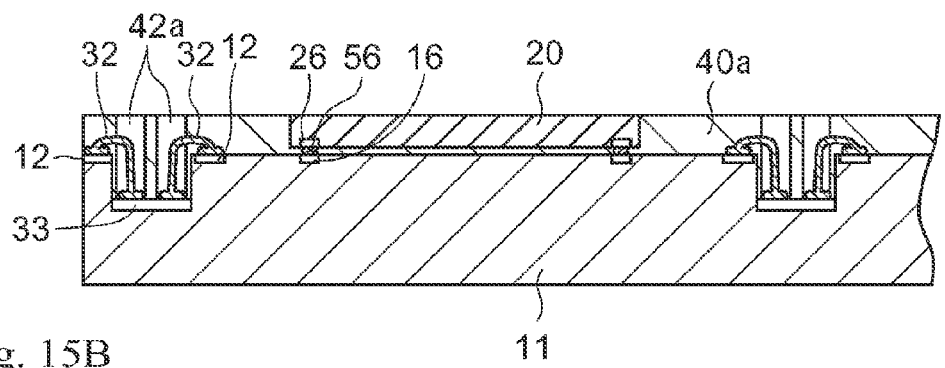
FIGS. 15A to 15C are cross sectional views (part 1) showing a manufacturing process of a semiconductor device of a fifth embodiment.
Figure 15B:
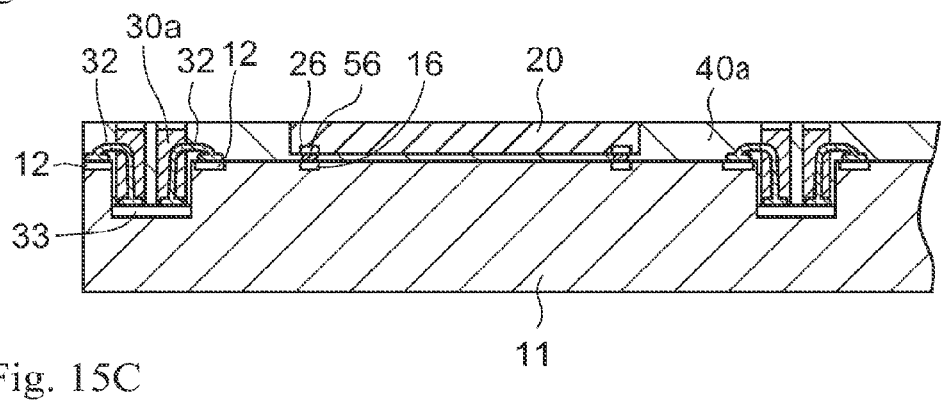
Figure 15C:
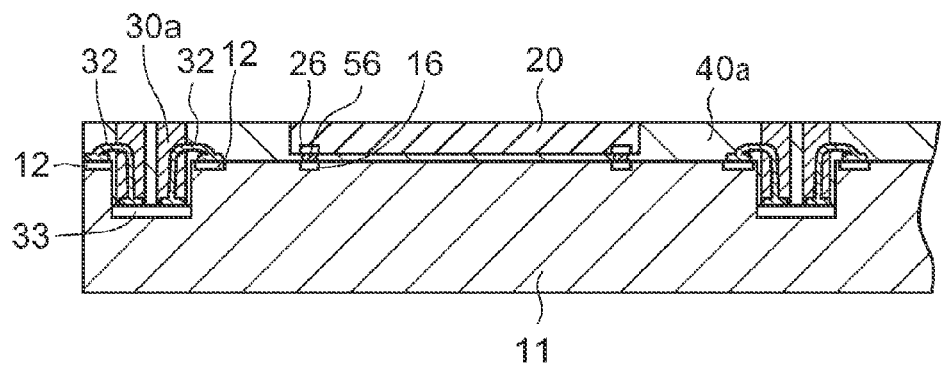

A fifth embodiment of the present invention is an instance of forming a columnar electrode for each bonding wire. Referring to FIG. 15A, the same processes as those in FIGS. 10A to 11C of the fourth embodiment are performed. Thereafter, on a groove 18, a through-hole 42a on a resin section 40a is formed so as to include the bonding wire 32 in each hole. Referring to FIG. 15B, similar to those in FIG. 12B of the fourth embodiment, inside the through-hole 42a, a columnar electrode 30a composed of Cu is formed. Referring to FIG. 15C, similar to those in FIG. 12C of the fourth embodiment, so as to make upper surfaces of the columnar electrode 30a and the resin section 40a flat, an upper surface of the resin section 40a is ground.

Figure 16A:
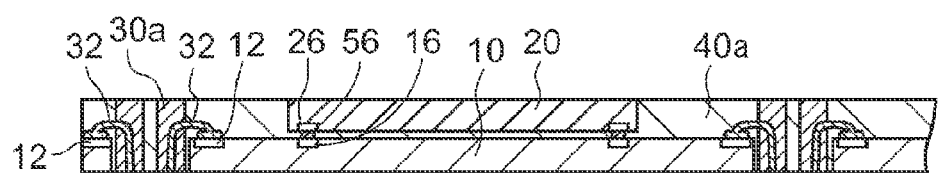
FIGS. 16A to 16C are cross sectional views (part 2) showing the manufacturing process of the semiconductor device of the fifth embodiment.
Figure 16B:
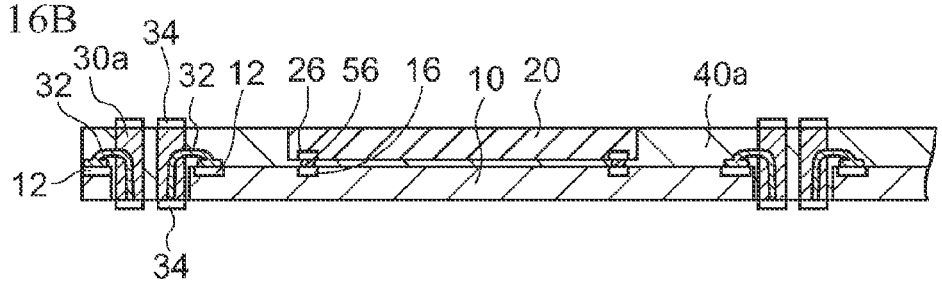
Figure 16C:
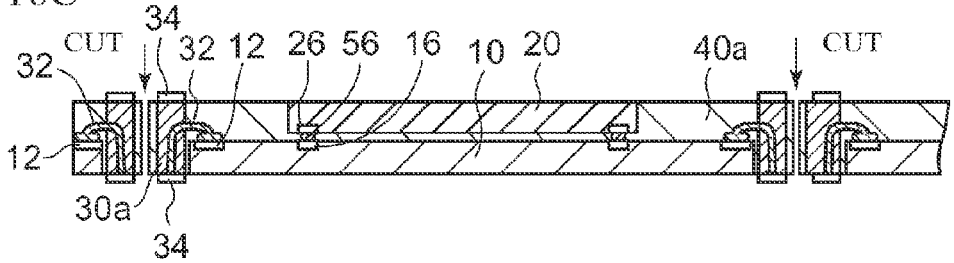

Referring to FIG. 16A, similar to those in FIG. 13A of the fourth embodiment, by grinding a lower surface of a semiconductor wafer 11 so as to expose a lower surface of the columnar electrode 30a, a first semiconductor chip 10 is formed. Referring to FIG. 16B, similar to those in FIG. 13B of the fourth embodiment, on the upper surface and the lower surface of the columnar electrode 30a, a metal layer 34 is formed. Referring to FIG. 16C, by cutting off the resin section 40a, the semiconductor chip 10 is separated.

Figure 17:
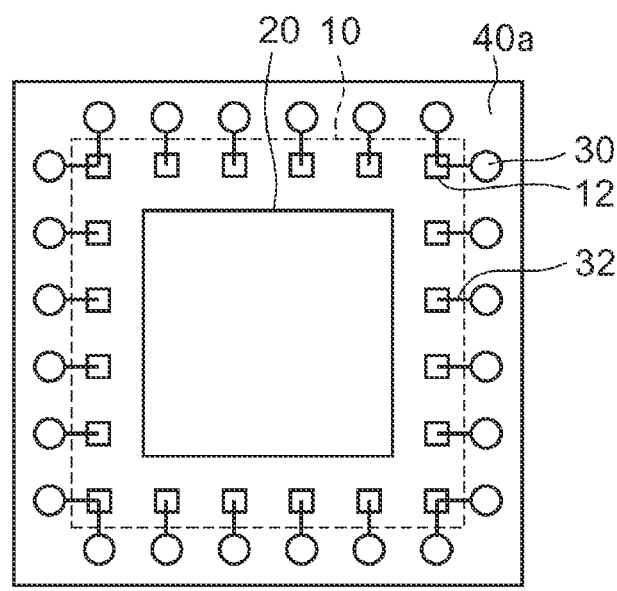
FIG. 17 is a plan view of the semiconductor device of the fifth embodiment viewed through a resin section.

FIG. 17 is a plan view of the semiconductor device of the fifth embodiment viewed through the resin section. As the resin section 40a between the columnar electrodes 30 is cut off, a side surface of the columnar electrode 30 is surrounded by the resin section 40a.

In accordance with the fifth embodiment, as shown in FIGS. 15A to 15C, the columnar electrode 30 is formed so as to respectively embed in different columnar electrodes 30 a plurality of bonding wires 32 which respectively connects the pad electrodes 12 of different first semiconductor chips 10 with the lower surface of the groove 18. As shown in FIG. 16C, by cutting off a semiconductor wafer 11 so as to make the different columnar electrodes 30a respectively belonged to the different first semiconductor chips 10, the first semiconductor chip 10 is separated. In the manufacturing method described above, as shown in FIG. 17, the periphery of the columnar electrode 30 is surrounded by the resin section 40a. As the columnar electrode 30a is not being cut off, a deterioration of blade from metal is restrained.

Sixth Embodiment

Figure 18A:
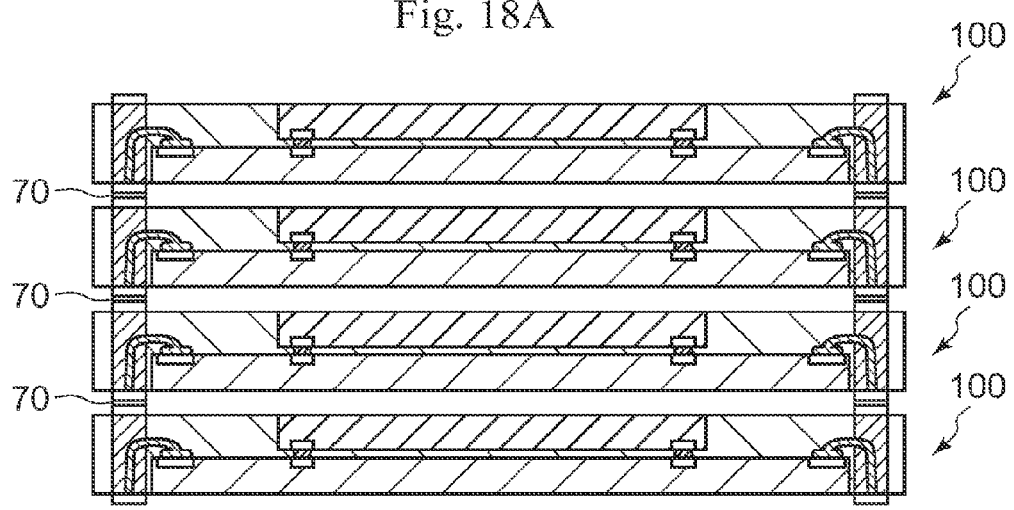
FIG. 18A and FIG. 18B are respectively a cross sectional view and a side view of a semiconductor device of a sixth embodiment.
Figure 18B:
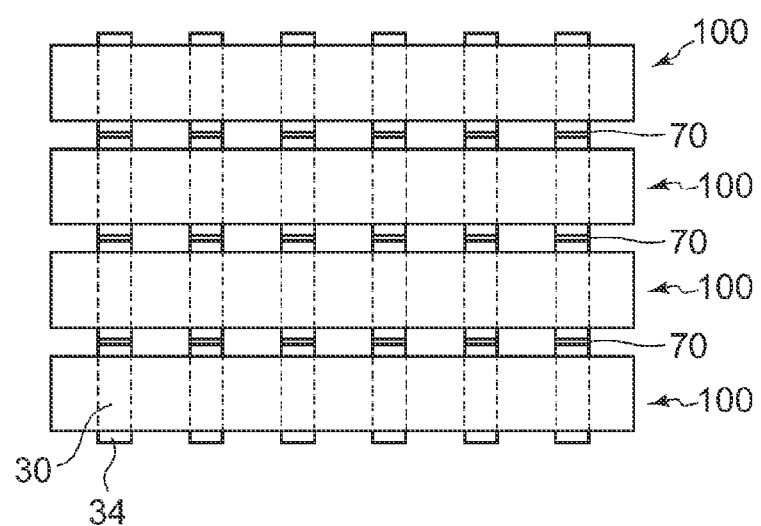

A sixth embodiment of the present invention is an instance of stacking semiconductor devices of the fifth embodiment. FIG. 18A is a cross sectional view of a semiconductor device of the sixth embodiment and FIG. 18B is its side view. By arranging a solder paste 70 between columnar electrodes 30 of semiconductor devices 100 above and below, the semiconductor devices 100 are stacked. The solder paste 70 is reflowed. In accordance with the sixth embodiment, a plurality of first semiconductor chips 10 are stacked as the columnar electrodes 30 of the semiconductor chips 10 above and below being superposed. In place of the semiconductor devices of the fifth embodiment, the semiconductor devices of the first to fourth embodiments may be stacked. Consequently, as the upper surface and the lower surface of the columnar electrode 30 of the semiconductor devices of the first to fifth embodiments are exposed on the resin section 40a, the semiconductor devices of the first to fifth embodiments can be stacked.

In the first to fifth embodiments, while examples are of the columnar electrode 30 being composed of Cu, as long as being conductive, the columnar electrode 30 may be composed of other materials. For example, solder may be used.

In the first to fifth embodiments, while examples of grinding the resin section 40 and the second semiconductor chip 20 or the semiconductor wafer 11 are described, in place of grinding, polishing may be used.

Now, several aspects of the present invention are summarized as follows.

According to a first aspect of the present invention, there is provided a semiconductor device includes: a first semiconductor chip having a pad electrode formed on an upper surface thereof; a resin section sealing the first semiconductor chip with the upper surface and a side surface of the first semiconductor chip being covered and a lower surface of the first semiconductor chip being exposed; a columnar electrode communicating between the upper surface and the lower surface of the resin section with the upper surface and the lower surface of the columnar electrode being exposed on the resin section and at least a part of the side surface of the columnar electrode being covered; and a bonding wire connecting the pad electrode and the columnar electrode with a part of the bonding wire being embedded in the columnar electrode so that one end of the bonding wire is exposed on the lower surface of the columnar electrode and the remaining part of the bonding wire is covered with the resin section. Accordingly, since the columnar electrode electrically connected to the first semiconductor chip is exposed on the upper surface and the lower surface of the resin section, it is possible to electrically connect the columnar electrode to the first semiconductor chip from the upper surface and the lower surface of the columnar electrode. Also, since the first semiconductor chip and the columnar electrode are connected by the bonding wire, the manufacturing process is simple, and it is therefore possible to reduce the manufacturing cost. In the above arrangement, the side surface of the columnar electrode may be surrounded by the resin section. It is therefore possible to maintain the strength of the resin section.

In the above arrangement, an outer side surface of the columnar electrode may be exposed on the resin section. It is therefore possible to electrically connect the columnar electrode to the first semiconductor chip from the side surface of the columnar electrode.

In the above arrangement, a metal film may be formed on the upper surface and the lower surface of the columnar electrode.

In the above arrangement, a second semiconductor chip may be bonded by flip-chip bonding on the first semiconductor chip with a lower surface and a side surface of the second semiconductor chip being covered with the resin section and an upper surface of the second semiconductor chip being exposed on the resin section. It is therefore possible to improve the packaging density of the semiconductor chip.

In the above arrangement, the columnar electrode may be made of copper or solder.

In the above arrangement, the first semiconductor chip may be provided in plurality and such semiconductor chips may be stacked so as to superpose the columnar electrodes for the first semiconductor chips above and below. It is therefore possible to stack the plurality of first semiconductor chips. Accordingly, the packaging density of the semiconductor chip can be improved.

According to a second aspect of the present invention, there is provided a method for manufacturing a semiconductor device includes: providing on a supporting plate a first semiconductor chip having a pad electrode formed on an upper surface thereof; connecting the pad electrode and an upper surface of the supporting plate using a bonding wire; forming on the supporting plate a columnar electrode with a part of the bonding wire being embedded therein, and a resin section sealing the first semiconductor chip, the columnar electrode and the remaining part of the bonding wire, and exposing the upper surface of the columnar electrode; removing the supporting plate; and separating the first semiconductor chip by cutting the resin section along the first semiconductor chip. Accordingly, since the columnar electrode and the pad electrode are connected with the bonding wire, it is possible to reduce the manufacturing cost.

The above method may also include: flip-chip bonding a second semiconductor chip on the first semiconductor chip; and forming the columnar electrode and the resin electrode may include: forming the resin section so as to expose an upper surface of the second semiconductor chip. Accordingly, it is possible to improve the packaging density of the semiconductor chip.

In the above method, forming the columnar electrode and the resin section may include: forming the resin section having a through-hole in which the columnar electrode is to be formed; and forming the columnar electrode in the through-hole. Accordingly, since the resin section is used as a mask to form the columnar electrode, it is possible to reduce the manufacturing cost.

In the above method, forming the columnar electrode and the resin section may include: forming on the supporting plate the columnar electrode so as to embed apart of the bonding wire therein; forming, the resin section so as to seal the first semiconductor chip, the remaining part of the bonding wire and the columnar electrode; and grinding or polishing an upper surface of the resin section so as to expose the upper surface of the columnar electrode.

According to a third aspect of the present invention, there is provided a method for manufacturing a semiconductor device includes; forming a groove on a semiconductor wafer having a pad electrode formed on an upper surface thereof; connecting the pad electrode and a lower surface of the groove by a bonding wire; forming on the semiconductor wafer a columnar electrode with a part of the bonding wire being embedded therein, and a resin section sealing the first semiconductor chip, the columnar electrode and the remaining part of the bonding wire, embedding the groove therein, and exposing the upper surface of the columnar electrode; forming the first semiconductor chip from the semiconductor wafer by grinding or polishing a lower surface of the semiconductor wafer so as to expose a lower surface of the columnar electrode; and separating the first semiconductor chip by cutting the resin section along the groove. Accordingly, since the first semiconductor chip is formed from the semiconductor wafer, it is possible to skip the process of arranging the first semiconductor chip. Therefore, the manufacturing cost can be reduced.

The above method may also include: flip-chip bonding a second semiconductor chip on the semiconductor wafer; and forming the columnar electrode and the resin section may include: forming the resin section so as to expose an upper surface of the second semiconductor chip. Accordingly, it is possible to improve the packaging density of the semiconductor chip.

In the above method, forming the columnar electrode and the resin section may include: forming the resin section having a through-hole in which the columnar electrode is to be formed; and forming the columnar electrode in the through-hole. Accordingly, since the resin section is used as a mask to form the columnar electrode, it is possible to reduce the manufacturing cost.

In the above method, forming the columnar electrode and the resin section may include: forming on a lower surface of the groove the columnar electrode so as to embed the part of the bonding wire therein; forming the resin section so as to seal the first semiconductor chip, the remaining part of the bonding wire and the columnar electrode; and grinding or polishing an upper surface of the resin section so as to expose the upper surface of the columnar electrode.

In the above method, forming the columnar electrode and the resin section may include: forming the columnar electrode by embedding a plurality of bonding wires that respectively connect the pad electrode of individual first semiconductor chips with the lower surface of the groove; and separating the first semiconductor chip may include: cutting the columnar electrode so that the plurality of bonding wires respectively belong to the individual first semiconductor chips. In the above method, forming the columnar electrode and the resin section may include: forming the columnar electrode so as to respectively embed in different columnar electrodes a plurality of bonding wires that respectively connects the pad electrode of the individual first semiconductor chips with the lower surface of the groove; and separating the first semiconductor chip may include: cutting the columnar electrode so that the different columnar electrodes respectively belong to the different first semiconductor chips.

In the above method, the columnar electrode may be formed by a plating method. Accordingly, it is possible to simply embed the bonding wire to the columnar electrode.

The above method may also include: stacking the plurality of first semiconductor chips so as to superpose the columnar electrode of the first semiconductor chip above and below. Accordingly, it is possible to improve the packaging density of the semiconductor chip.

As described above, as the columnar electrode which is electrically connected to the first semiconductor chip is exposed on the upper surface and the lower surface of the resin section, it is possible to electrically connect the columnar electrode to the first semiconductor chip from the upper surface and the lower surface of the columnar electrode. As the columnar electrode is connected with the first semiconductor chip by the bonding wire, the manufacturing process becomes simple and the manufacturing cost is cut down.

While the preferred embodiments of the present invention have been described in details above, the present invention is not limited to those specific embodiments, and within the spirit and scope of the present invention, various modifications and alterations can be made.

I claim:

1. A method for manufacturing a semiconductor device comprising:
    forming a groove on a semiconductor wafer having a pad electrode formed on an upper surface thereof;
    connecting the pad electrode and a lower surface of the groove by a bonding wire;
    forming on the semiconductor wafer a columnar electrode with a part of the bonding wire being embedded therein, and a resin section sealing the columnar electrode, the remaining part of the bonding wire and the semiconductor wafer, embedding the groove therein, and exposing the upper surface of the columnar electrode;
    forming a first semiconductor chip from the semiconductor wafer by:
        grinding or polishing a lower surface of the semiconductor wafer so as to expose a lower surface of the columnar electrode; and
        separating the first semiconductor chip from the semiconductor wafer by cutting the resin section and columnar electrode along the groove.

2. The method according to claim 1, wherein a side surface of the columnar electrode is surrounded by the resin section.

3. The method according to claim 1, wherein an outer surface of the columnar electrode is exposed on the resin section.

4. The method according to claim 1, further comprising forming a metal film on the upper surface and the lower surface of the columnar electrode.

5. The method according to claim 1, further comprising bonding a second semiconductor chip flip-chip on the semiconductor wafer where the first semiconductor chip is to be formed, with a lower surface and a side surface of the second semiconductor chip being covered with the resin section and an upper surface of the second semiconductor chip being exposed on the resin section.

6. The method according to claim 1, wherein the columnar electrode is made of copper or solder.

7. The method according to claim 1, wherein the first semiconductor chip is provided in plurality and such first semiconductor chips are stacked so as to superpose the columnar electrodes for the first semiconductor chips above and below.

8. A method for manufacturing a semiconductor device comprising:
    forming a groove on a semiconductor wafer having a pad electrode formed on an upper surface thereof;
    connecting the pad electrode and a lower surface of the groove by a bonding wire;
    sealing with a resin section the bonding wire and the semiconductor wafer;
    forming a through-hole in the resin section exposing part of the bonding wire;
    forming inside the through-hole a columnar electrode with the exposed part of the bonding wire being embedded therein;

forming a first semiconductor chip from the semiconductor wafer by:
  grinding or polishing a lower surface of the semiconductor wafer so as to expose a lower surface of the columnar electrode; and
  separating the first semiconductor chip from the semiconductor wafer by cutting the resin section and columnar electrode along the groove.

9. The method according to claim 8, wherein forming the through-hole comprises exposing a conductive layer on a lower surface of the groove to which the pad electrode is connected by the bonding wire, and wherein the columnar electrode is formed using an electrolytic plating method by supplying an electric current through the conductive layer.

10. The method according to claim 8, further comprising prior to sealing with the resin section bonding a second semiconductor chip flip-chip on the semiconductor wafer where the first semiconductor chip is to be formed, with a lower surface and a side surface of the second semiconductor chip being covered with the resin section and an upper surface of the second semiconductor chip being exposed on the resin section.

11. The method according to claim 8, wherein the columnar electrode is made of copper or solder.

12. The method according to claim 8, wherein the first semiconductor chip is provided in plurality and such first semiconductor chips are stacked so as to superpose the columnar electrodes for the first semiconductor chips above and below.

13. A method for manufacturing a semiconductor device comprising:
  forming a groove on a semiconductor wafer having a first and second pad electrodes formed on an upper surface thereof, the first and second pad electrodes separated by the groove;
  connecting the first and second pad electrodes and a lower surface of the groove by a first and second bonding wires;
  sealing with a resin section the first and second pad electrodes, first and second bonding wires and the semiconductor wafer;
  forming in the groove through the resin section a first through-hole exposing part of the first bonding wire and a second through-hole exposing part of the second bonding wire, wherein the first through-hole is separated from the second through-hole by the resin section remaining in the groove;
  forming inside the first through-hole a first columnar electrode with the exposed part of the first bonding wire being embedded therein, and inside the second through-hole a second columnar electrode with the exposed part of the second bonding wire being embedded therein;
  forming a first semiconductor chip from the semiconductor wafer by:
    grinding or polishing a lower surface of the semiconductor wafer so as to expose lower surfaces of the first and second columnar electrodes; and
    separating the first semiconductor chip from the semiconductor wafer by cutting the resin section remaining in the groove and separating the first and second columnar electrodes.

14. The method according to claim 13, wherein forming the first and second through-holes comprise exposing a conductive layer on a lower surface of the groove to which the first and second pad electrodes are connected by the first and second bonding wires, and wherein the first and second columnar electrodes are formed using an electrolytic plating method by supplying an electric current through the conductive layer.

15. The method according to claim 13, further comprising prior to sealing with the resin section bonding a second semiconductor chip flip-chip on the semiconductor wafer where the first semiconductor chip is to be formed, with a lower surface and a side surface of the second semiconductor chip being covered with the resin section and an upper surface of the second semiconductor chip being exposed on the resin section.

* * * * *